United States Patent
Park et al.

(10) Patent No.: US 9,574,108 B2
(45) Date of Patent: Feb. 21, 2017

(54) COMPOSITION FOR FORMING SILICA BASED INSULATING LAYER, SILICA BASED INSULATING LAYER AND METHOD FOR MANUFACTURING SILICA BASED INSULATING LAYER

(71) Applicants: Eun-Su Park, Uiwang-si (KR); Taek-Soo Kwak, Uiwang-si (KR); Yoong-Hee Na, Uiwang-si (KR); Hyun-Ji Song, Uiwang-si (KR); Han-Song Lee, Uiwang-si (KR); Seung-Hee Hong, Uiwang-si (KR)

(72) Inventors: Eun-Su Park, Uiwang-si (KR); Taek-Soo Kwak, Uiwang-si (KR); Yoong-Hee Na, Uiwang-si (KR); Hyun-Ji Song, Uiwang-si (KR); Han-Song Lee, Uiwang-si (KR); Seung-Hee Hong, Uiwang-si (KR)

(73) Assignee: CHEIL INDUSTRIES, INC., Gumi-si, Gyeongsangbuk-Do (KR)

( * ) Notice: Subject to any disclaimer, the term of this patent is extended or adjusted under 35 U.S.C. 154(b) by 58 days.

(21) Appl. No.: 14/259,845

(22) Filed: Apr. 23, 2014

(65) Prior Publication Data
US 2015/0044883 A1   Feb. 12, 2015

(30) Foreign Application Priority Data
Aug. 8, 2013  (KR) .................. 10-2013-0094274

(51) Int. Cl.
| | | |
|---|---|---|
| C08L 83/05 | (2006.01) | |
| B05D 1/00 | (2006.01) | |
| C09D 183/04 | (2006.01) | |
| C08L 83/02 | (2006.01) | |
| H01L 21/02 | (2006.01) | |

(52) U.S. Cl.
CPC ............ *C09D 183/04* (2013.01); *C08L 83/02* (2013.01); *H01L 21/02126* (2013.01); *H01L 21/02216* (2013.01); *H01L 21/02282* (2013.01)

(58) Field of Classification Search
USPC ............... 524/588, 858; 528/32, 36
See application file for complete search history.

(56) References Cited

U.S. PATENT DOCUMENTS

| | | | |
|---|---|---|---|
| 3,477,973 A * | 11/1969 | Lengnick ............. | C07F 7/1896 528/17 |
| 5,741,859 A * | 4/1998 | Saxena .................. | C08F 8/42 525/106 |
| 6,177,143 B1 | 1/2001 | Treadwell et al. | |
| 6,204,201 B1 | 3/2001 | Ross | |
| 6,395,607 B1 | 5/2002 | Chung | |
| 2005/0042464 A1 | 2/2005 | Shiota et al. | |
| 2006/0134441 A1 | 6/2006 | Mah et al. | |
| 2012/0237873 A1* | 9/2012 | Fujiwara .............. | C08G 77/14 430/280.1 |

FOREIGN PATENT DOCUMENTS

| | | |
|---|---|---|
| CN | 101617010 A | 12/2009 |
| JP | 2001-106914 A | 4/2001 |
| JP | 2004-256586 * | 9/2004 |
| JP | 2011-505448 A | 2/2011 |
| KR | 10-2001-0078164 A | 8/2001 |
| KR | 10-2006-0068348 A | 6/2006 |
| KR | 10-2009-0057450 A | 6/2009 |
| KR | 10-2013-00690 51 | 6/2016 |
| TW | 200528501 A | 9/2005 |

OTHER PUBLICATIONS

English abstract of JP 2004-256586, Sep. 2004, Japan.*

* cited by examiner

*Primary Examiner* — Tae H Yoon
(74) *Attorney, Agent, or Firm* — Lee & Morse, P.C.

(57) ABSTRACT

A composition for forming a silica-based insulation layer, a silica-based insulation layer, and a method of manufacturing the silica-based insulation layer, the composition including a solvent; and an organosilane-based condensation polymerization product that includes a structural unit represented by the following Chemical Formula 1:

[Chemical Formula 1]

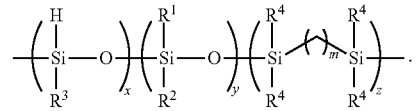

11 Claims, No Drawings

COMPOSITION FOR FORMING SILICA BASED INSULATING LAYER, SILICA BASED INSULATING LAYER AND METHOD FOR MANUFACTURING SILICA BASED INSULATING LAYER

CROSS-REFERENCE TO RELATED APPLICATION

Korean Patent Application No. 10-2013-0094274, filed on Aug. 8, 2013, in the Korean Intellectual Property Office, and entitled: "Composition For Forming Silica Based Insulating Layer, Silica Based Insulating Layer And Method For Manufacturing Silica Based Insulating Layer," is incorporated by reference herein in its entirety.

BACKGROUND

1. Field

Embodiments relate to a composition for forming a silica-based insulation layer, a silica-based insulation layer, and a method of manufacturing the silica-based insulation layer.

2. Description of the Related Art

Due to accelerating development of semiconductor technologies, research on a highly-integrated and high-speed semiconductor memory cell having improved performance by increasing integration of a semiconductor chip having a smaller size has been considered.

SUMMARY

Embodiments are directed to a composition for forming a silica-based insulation layer, a silica-based insulation layer, and a method of manufacturing the silica-based insulation layer.

The embodiments may be realized by providing a composition for forming a silica-based insulation layer, the composition including a solvent; and an organosilane-based condensation polymerization product that includes a structural unit represented by the following Chemical Formula 1:

[Chemical Formula 1]

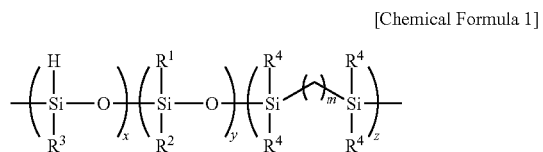

wherein, in the above Chemical Formula 1, $R^1$ is hydrogen, a hydroxy group, a substituted or unsubstituted C1 to C4 alkyl group, a substituted or unsubstituted C6 to C20 aryl group, a vinyl group, or a combination thereof, $R^2$ to $R^4$ are each independently hydrogen, a hydroxy group, a substituted or unsubstituted C1 to C20 alkoxy group, a halogen-containing group, a silicon-containing group, or a combination thereof, m is an integer of 1 to 6, and x, y, and z represent a relative mole ratio of each repeating unit, and satisfy the following relations: $0.05 \leq x \leq 0.50$, $0.45 \leq y \leq 0.90$, $0.05 \leq z \leq 0.50$, and $x+y+z=1$.

The organosilane-based condensation polymerization product may have a weight average molecular weight (Mw) of about 3,000 to about 20,000.

The organosilane-based condensation polymerization product may be included in an amount of about 0.1 wt % to about 50 wt %, based on a total weight of the composition.

The composition may further include a thermal acid generator.

The embodiments may be realized by providing a silica-based insulation layer prepared from the composition for forming a silica-based insulation layer according to an embodiment.

The insulation layer may have a dielectric constant (k) of about 1.9 to about 3.5.

The insulation layer may have a modulus (E) of about 4 GPa to about 18 GPa.

The embodiments may be realized by providing a method of manufacturing a silica-based insulation layer, the method including coating the composition for forming a silica-based insulation layer according to an embodiment on a substrate; drying the substrate coated with the composition for forming a silica-based insulation layer; and curing the resultant at about 200° C. or more under an inert gas atmosphere.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

As used herein, when a definition is not otherwise provided, the term 'substituted' may refer to one substituted with a substituent selected from deuterium (D), a halogen atom (F, Cl, Br, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C7 to C30 arylalkyl group, a C1 to C4 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, and a combination thereof, instead of hydrogen of a compound.

As used herein, when a definition is not otherwise provided, the term 'hetero' refers to one including 1 to 3 heteroatoms selected from N, O, S, and P.

Hereinafter, a composition for forming a silica-based insulation layer according to one embodiment is described.

A composition for forming a silica-based insulation layer according to an embodiment may include a solvent and an organosilane-based condensation polymerization product including a structural unit represented by the following Chemical Formula 1.

[Chemical Formula 1]

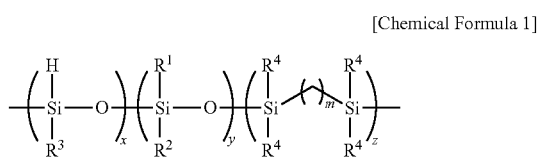

In the above Chemical Formula 1, $R^1$ may be hydrogen, a hydroxy group, a substituted or unsubstituted C1 to C4 alkyl group, a substituted or unsubstituted C6 to C20 aryl group, a vinyl group, or a combination thereof, $R^2$ to $R^4$ may each independently be hydrogen, a hydroxy group, a substituted or unsubstituted C1 to C20 alkoxy group, a halogen-containing group, a silicon-containing group, or a combination thereof, m is an integer of 1 to 6, and x, y, and z represent a relative mole ratio of each repeating unit, and satisfy the following relations: $0.05 \leq x \leq 0.50$, $0.45 \leq y \leq 0.90$, $0.05 \leq z \leq 0.50$, and $x+y+z=1$.

First, second, and third repeating units bracketed by the x, y and z may be arranged in order or randomly arranged. In addition, more than two out of the first, second, and third repeating units may be included, if desired.

In $(CH_2)_m$ (indicating a linking group in the three repeating units), the m may be about 1 to about 6, e.g., about 1 to about 3.

The organosilane-based condensation polymerization product may include a structural unit represented by the above Chemical Formula 1 and thus, may provide an insulation layer relatively having a uniform pore and small interconnection. Accordingly, the insulation layer prepared from the composition that includes the organosilane-based condensation polymerization product may exhibit a low dielectric constant and high hardness and modulus (e.g., Young's modulus E).

The organosilane-based condensation polymerization product may have a weight average molecular weight (Mw) of about 3,000 to about 20,000, e.g., about 4,000 to about 10,000.

The composition for forming a silica-based insulation layer may further include a thermal acid generator (TAG).

The thermal acid generator may be help improve developability of the composition for forming a silica-based insulation layer, and may facilitate development of the organosilane-based condensation polymerization product in the composition at a relatively low temperature.

The thermal acid generator may include a suitable compound that generates acid ($H^+$) in response to heat. For example, the thermal acid generator may include a compound activated at about 90° C. or higher and that generates sufficient acid and that also has low volatility.

The thermal acid generator may include, e.g., a compound represented by the following Chemical Formula 2.

  [Chemical Formula 2]

In the above Chemical Formula 2, $R^5$ may be a substituted or unsubstituted C1 to C20 alkyl group, a cyclic alkyl group, an aromatic group, or a combination thereof.

A may be $NO_3^-$, $OH^-$, or a combination thereof.

In an implementation, the thermal acid generator may include, e.g., nitrobenzyl tosylate, nitrobenzyl benzenesulfonate, phenol sulfonate, or a combination thereof.

The thermal acid generator may be included in an amount of about 0.01 to about 25 wt %, based on the total weight of the composition for forming a silica-based insulation layer. Within the range, the condensation polymerization product may be developed at a relatively low temperature and simultaneously, may have improved coating properties.

The composition for forming a silica-based insulation layer may further include a surfactant.

The surfactant may include, e.g., a non-ionic surfactant such as polyoxyethylene alkyl ethers such as polyoxyethylene lauryl ether, polyoxyethylene stearyl ether, polyoxyethylene cetyl ether, polyoxyethylene oleyl ether, and the like, polyoxyethylene alkylallyl ethers such as polyoxyethylenenonyl phenol ether, and the like, polyoxyethylene•polyoxypropylene block copolymers, polyoxyethylene sorbitan fatty acid ester such as sorbitan monolaurate, sorbitan monopalmitate, sorbitan monostearate, sorbitan monoleate, polyoxyethylene sorbitan monostearate, polyoxyethylene sorbitan trioleate, polyoxyethylene sorbitan tristearate, and the like; a fluorine-based surfactant of EFTOP EF301, EF303, EF352 (Tochem Products Co., Ltd.), MEGAFACE F171, F173 (Dainippon Ink & Chem., Inc.), FLUORAD FC430, FC431 (Sumitomo 3M), Asahi guardAG710, Surflon S-382, SC101, SC102, SC103, SC104, SC105, SC106 (Asahi Glass Co., Ltd.), and the like; other silicone-based surfactant such as a organosiloxane polymer KP341 (Shin-Etsu Chemical Co., Ltd.), and the like.

The surfactant may be included in an amount of about 0.001 wt % to about 10 wt %, based on the total weight of the composition for forming a silica-based insulation layer. Within the range, dispersion of a solution and simultaneously, uniform thickness of a layer and filling properties may be improved.

The composition for forming a silica-based insulation layer may be a solution where the organosilane-based condensation polymerization product and the other components are dissolved in a solvent.

The solvent may include a suitable solvent that is capable of dissolving the components, e.g., alcohols such as methanol, ethanol and the like; ethers such as dichloroethyl ether, di-n-butyl ether, diisoamyl ether, methylphenyl ether, tetrahydrofuran and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; oxy alkyl acetate esters such as oxy methyl acetate, oxy ethyl acetate, oxy butyl acetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy alkyl propionate esters such as 3-oxy methyl propionate, 3-oxy ethyl propionate, and the like; 3-alkoxy alkyl propionate esters such as 3-methoxy methyl propionate, 3-methoxy ethyl propionate, 3-ethoxy ethyl propionate, 3-ethoxy methyl propionate, and the like; 2-oxy alkyl propionate esters such as 2-oxy methyl propionate, 2-oxy ethyl propionate, 2-oxy propyl propionate, and the like; 2-alkoxy alkyl propionate esters such as 2-methoxy methyl propionate, 2-methoxy ethyl propionate, 2-ethoxy ethyl propionate, 2-ethoxy methyl propionate, and the like; 2-oxy-2-methyl propionate esters such as 2-oxy-2-methyl methyl propionate, 2-oxy-2-methyl ethyl propionate and the like, 2-monooxy monocarboxylic acid alkyl esters of alkoxy-2-methyl alkyl propionate such as 2-methoxy-2-methyl methyl propionate, 2-ethoxy-2-methyl ethyl propionate and the like; esters such as 2-hydroxy ethyl propionate, 2-hydroxy-2-methyl ethyl propionate, hydroxy ethyl acetate, 2-hydroxy-3-methyl methyl butanoate, and the like;

ketonate esters such as ethyl pyruvate, and the like. In an implementation, a solvent having a high boiling point such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetnylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, carbonate ethylene, carbonate propylene, phenyl cellosolve acetate, and the like may be added. Among them, at least one selected from diethylene glycolmonomethylether, diethylene glycoldiethylether, ethyl-3-ethoxy propionate, methyl-3-methoxy propionate, cyclopentanone, cyclohexanone, propylene glycolmonomethyl ether acetate, propylene glycoldimethyletheracetate, 1-methoxy-2-propanol, ethyl lactate, cyclopentanone and hydroxyacetic acidethyl may be selected.

In an implementation, the solvent may include at least one solvent having a high boiling point. In this case, the solvent may help prevent generation of a void inside a gap when the gap is filled and also, may be slowly volatilized and thus, may help increase film flatness.

The solvent may be included in a balance amount, except the above components based on the total weight of the composition for forming a silica-based insulation layer.

According to another embodiment, a silica-based insulation layer may be manufactured using the composition for forming a silica-based insulation layer.

FIG. 1 illustrates a silica-based insulation layer according to an embodiment. For example, the silica-based insulation layer 1 may be manufactured using the composition for forming a silica-based insulation layer.

The insulation layer may have a low dielectric constant and simultaneously, may secure excellent mechanical characteristics. For example, the insulation layer may have a dielectric constant (k) of about 1.9 to about 3.5 and a modulus (E) of about 4 GPa to about 18 GPa.

Herein, the dielectric constant (k) is measured by using a DC measurement system having a Summit11971b (Cascade Microtech Inc.), 4156C (Agilent Technologies), and 4200-SCS (Keithley Instruments Inc.), and the modulus (E) is measured b using TI750 Ubi (Hysistron Inc.).

According to another embodiment, a method of manufacturing a silica-based insulation layer may include coating the above composition for forming a silica-based insulation layer on a substrate; drying the substrate coated with the composition for forming a silica-based insulation layer; and curing the resultant at about 200° C. or more under an inert gas atmosphere.

The substrate may be, e.g., a device substrate such as a semiconductor, liquid crystal, and the like but is not limited thereto.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of Organic Silane-Based Condensation Polymerization Product

Comparative Synthesis Example 1

10 g of triethoxysilane was added to 100 g of methylisobutylketone (MIBK) in a 250 ml 3-necked flask having a bar magnet for agitation, a cooling tube, and a rubber cap, and 10 g of a 5 ppm nitric acid aqueous solution was added thereto. Subsequently, the mixture was reacted at room temperature for 10 days and further reacted for 4 days more by increasing its temperature up to 40° C., obtaining an organosilane-based condensation polymerization product.

The weight average molecular weight (Mw) of the product was 3,500, and its polydispersity index (PDI) was 1.9.

Comparative Synthesis Example 2

5 g of triethoxysilane and 5 g of methyltrimethoxysilane (MTMS) were added to 100 g of methylisobutylketone (MIBK) in a 250 me, 3-necked flask having a bar magnet for agitation, a cooling tube, and a rubber cap, and 10 g of a 5 ppm nitric acid aqueous solution was added thereto. Subsequently, the mixture was reacted at room temperature for 10 days and further reacted for 4 days more by increasing its temperature up to 40° C., obtaining an organosilane-based condensation polymerization product.

The weight average molecular weight (Mw) of the product was 3,500, and its polydispersity index (PDI) was 2.0.

Comparative Synthesis Example 3

10 g of triethoxysilane and 5 g of polyethylene glycol dimethyl ether were added to 100 g of methylisobutylketone (MIBK) in a 250 ml 3-necked flask having a bar magnet for agitation, a cooling tube, and a rubber cap, and 10 g of a 5 ppm nitric acid aqueous solution was added thereto. Subsequently, the mixture was reacted at room temperature for 10 days and further reacted for 4 days more by increasing its temperature up to 40° C., obtaining an organosilane-based condensation polymerization product.

The weight average molecular weight (Mw) of the produce was 3,600, and its polydispersity index (PDI) was 2.2.

Comparative Synthesis Example 4

5 g of triethoxysilane, 5 g of methyltrimethoxysilane (MTMS), and 10 g of polyethylene glycol dimethyl ether were added to 100 g of methylisobutylketone (MIBK) in a 250 ml 3-necked flask having a bar magnet for agitation, a cooling tube, and a rubber cap, and 10 g of a 5 ppm nitric acid aqueous solution was added thereto. Subsequently, the mixture was reacted at room temperature for 10 days and further reacted for 4 days more by increasing its temperature up to 40° C., obtaining an organosilane-based condensation polymerization product.

The weight average molecular weight (Mw) of the product was 3,700, and its polydispersity index (PDI) was 1.9.

Synthesis Example 1

2.5 g of triethoxysilane, 2.5 g of 1,2-bistriethoxysilylethane, and 5 g of methyltrimethoxysilane (MTMS) were added to 100 g of methylisobutylketone (MIBK) in a 250 ml 3-necked flask having a bar magnet for agitation, a cooling tube, and a rubber cap, and 10 g of a 5 ppm nitric acid aqueous solution was added thereto. Subsequently, the mixture was reacted at room temperature for 10 days and further reacted for 4 days more by increasing its temperature up to 40° C., obtaining an organosilane-based condensation polymerization product.

The weight average molecular weight (Mw) of the product was 3,800, and its polydispersity index (PDI) was 1.9.

Synthesis Example 2

2.5 g of triethoxysilane, 2.5 g of 1,2-bistriethoxysilylethane, and 5 g of methyltrimethoxysilane (MTMS) were added to 100 g of propylene glycol methyl ether acetate (PGMEA) in a 250 ml 3-necked flask having a bar magnet for agitation, a cooling tube, and a rubber cap, and 10 g of a 5 ppm nitric acid aqueous solution was added thereto. Subsequently, the mixture was reacted at room temperature for 10 days and further reacted for 4 days more by increasing its temperature up to 40° C., obtaining an organosilane-based condensation polymerization product.

The weight average molecular weight (Mw) of the product was 3,900, and its polydispersity index (PDI) was 2.1.

Synthesis Example 3

2.5 g of triethoxysilane, 2.5 g of 1,2-bistriethoxysilylethane, 5 g of methyltrimethoxysilane (MTMS), and 10 g of polypropylene glycol monobutyl ether were added to 100 g of propylene glycol methyl ether acetate (PGMEA) in a 250 mf 3-necked flask having a bar magnet for agitation, a cooling tube, and a rubber cap, and 10 g of a 5 ppm nitric acid aqueous solution was added thereto. Subsequently, the mixture was reacted at room temperature for 10 days and further reacted for 4 days more by increasing its temperature up to 40° C., obtaining an organosilane-based condensation polymerization product.

The weight average molecular weight (Mw) of the product was 3,900, and its polydispersity index (PDI) was 2.1.

Synthesis Example 4

2.5 g of triethoxysilane, 2.5 g of 1,2-bistriethoxysilylethane, 5 g of methyltrimethoxysilane (MTMS), and 10 g of polyethylene glycol dimethyl ether were added to 100 g of propylene glycol methyl ether acetate (PGMEA) in a 250 ml 3-necked flask having a bar magnet for agitation, a cooling tube, and a rubber cap, and 10 g of a 5 ppm nitric acid aqueous solution was added thereto. Subsequently, the mixture was reacted at room temperature for 10 days and further reacted for 4 days more by increasing its temperature up to 40° C., obtaining an organosilane-based condensation polymerization product.

The weight average molecular weight (Mw) of the product was 3,800, and its polydispersity index (PDI) was 2.0.

Preparation of Silica-based Insulation Layer

Comparative Example 1

The organosilane-based condensation polymerization product according to Comparative Synthesis Example 1 was spin-coated on a silicon wafer, baked at 150° C. for 1 minute, and then, allowed to stand for 30 minutes after its temperature was increased up to 430° C. under a $N_2$ atmosphere, forming a 4,500 Å-thick insulation layer.

Comparative Example 2

The organosilane-based condensation polymerization product according to Comparative Synthesis Example 2 was spin-coated on a silicon wafer, baked at 150° C. for 1 minute, and then, allowed to stand for 30 minutes after its temperature was increased up to 430° C. under a $N_2$ atmosphere, forming a 4,500 Å-thick insulation layer.

Comparative Example 3

The organosilane-based condensation polymerization product according to Comparative Synthesis Example 3 was spin-coated on a silicon wafer, baked at 150° C. for 1 minute, and then, allowed to stand for 30 minutes after temperature, and then, allowed to stand after its temperature was increased up to 430° C. under a $N_2$ atmosphere, forming a 4,600 Å-thick insulation layer.

Comparative Example 4

The organosilane-based condensation polymerization product according to Comparative Synthesis Example 4 was spin-coated on a silicon wafer, baked at 150° C. for 1 minute, and then, allowed to stand for 30 minutes after temperature, and then, allowed to stand after its temperature was increased up to 430° C. under a $N_2$ atmosphere, forming a 4,600 Å-thick insulation layer.

Example 1

The organosilane-based condensation polymerization product according to Synthesis Example 1 was spin-coated on a silicon wafer, baked at 150° C. for 1 minute, and then, allowed to stand for 30 minutes, after its temperature was increased up to 430° C. under a $N_2$ atmosphere, forming a 4,700 Å-thick insulation layer.

Example 2

The organosilane-based condensation polymerization product according to Synthesis Example 2 was spin-coated on a silicon wafer, baked at 150° C. for 1 minute, and then, allowed to stand for 30 minutes, after its temperature was increased up to 430° C. under a $N_2$ atmosphere, forming a 4,600 Å-thick insulation layer.

Example 3

The organosilane-based condensation polymerization product according to Synthesis Example 3 was spin-coated on a silicon wafer, baked at 150° C. for 1 minute, and then, allowed to stand for 30 minutes, after its temperature was increased up to 430° C. under a $N_2$ atmosphere, forming a 4,600 Å-thick insulation layer.

Example 4

The organosilane-based condensation polymerization product according to Synthesis Example 4 was spin-coated on a silicon wafer, baked at 150° C. for 1 minute, and then, allowed to stand for 30 minutes, after its temperature was increased up to 430° C. under a $N_2$ atmosphere, forming a 4,700 Å-thick insulation layer.

Example 5

0.5 wt % of tetrabutylammonium nitrate was added to the organosilane-based condensation polymerization product according to Synthesis Example 4, and the mixture was spin-coated on a silicon wafer and baked at 150° C. for 1 minute. Subsequently, the baked silicon wafer was allowed to stand for 30 minutes after its temperature was increased up to 430° C. under a $N_2$ atmosphere, forming a 4,900 Å-thick insulation layer.

Example 6

0.5 wt % of tripropylamine was added to the organosilane-based condensation polymerization product according to Synthesis Example 4, and the mixture was spin-coated on a silicon wafer and baked at 150° C. for 1 minute. Subsequently, the baked silicon wafer was allowed to stand for 30 minutes after its temperature was increased up to 300° C. under a $N_2$ atmosphere, forming a 4,800 Å-thick insulation layer.

Evaluation

Refractive index (n), dielectric constant (k), hardness (H), and modulus (E) of the insulation layers according to Comparative Examples 1 to 4 and Examples 1 to 6 were measured.

A device and a condition for the measurement were provided as follows.

Refractive Index and Thickness: measured at a wavelength of 632.8 nm by using ST-4000 (K-Mac Inc.).

Modulus and Hardness: TI750 Ubi (Hysistron Inc.)

Dielectric Constant: measured by using a DC measurement system having Summit11971b (Casecade Microtech Inc), 4156C (Agilent Technologies), and 4200-SCS (Keithley Instruments Inc.).

The measurement results are provided in Table 1, below.

| | Thickness (nm) | Refractive index (632.8 nm) | Modulus (GPa) | Hardness (GPa) | Dielectric constant (k) |
|---|---|---|---|---|---|
| Comparative Example 1 | 450 | 1.402 | 5.0 | 1.5 | 3.1 |
| Comparative Example 2 | 450 | 1.385 | 3.0 | 0.9 | 2.7 |
| Comparative Example 3 | 460 | 1.341 | 2.0 | 0.6 | 2.3 |
| Comparative Example 4 | 460 | 1.298 | 6.0 | 1.9 | 2.2 |
| Example 1 | 470 | 1.301 | 10.1 | 2.2 | 3.0 |
| Example 2 | 460 | 1.302 | 10.3 | 2.3 | 3.1 |
| Example 3 | 460 | 1.289 | 7.8 | 2.0 | 2.2 |
| Example 4 | 470 | 1.287 | 7.9 | 2.0 | 2.2 |
| Example 5 | 490 | 1.290 | 7.8 | 2.0 | 2.2 |
| Example 6 | 480 | 1.291 | 7.8 | 2.1 | 2.2 |

Referring to Table 1, the silica-based insulation layers according to Examples 1 and 2 showed a similar dielectric constant to but about twice as high modulus and hardness as the silica-based insulation layers according to Comparative Examples 1 and 2.

In addition, the silica-based insulation layers according to Examples 3 to 6 maintained a low dielectric constant and exhibited high modulus and hardness, compared with the silica-based insulation layers according to Comparative Examples 3 and 4.

By way of summation and review, requirements of the high integration of a semiconductor may narrow a distance among wires and thus, may bring about a RC delay, a cross-talk, deterioration of a response speed, and the like, which may cause a problem in terms of interconnection of the semiconductor. Accordingly, the embodiments may provide an insulation layer material having a low dielectric constant and also, high hardness and/or modulus during integration of the semiconductor.

The embodiments may provide an insulation layer having a low dielectric constant and simultaneously having excellent mechanical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for forming a silica-based insulation layer, the composition comprising:
    a solvent; and
    an organosilane-based condensation polymerization product that includes a structural unit represented by the following Chemical Formula 1:

[Chemical Formula 1]

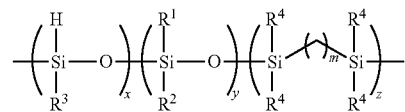

wherein, in the above Chemical Formula 1,
    $R^1$ includes hydrogen, a hydroxy group, a C1 to C4 alkyl group, a C6 to C20 aryl group, a vinyl group, or a combination thereof,
    $R^2$ to $R^4$ each independently include hydrogen, a hydroxy group, a C1 to C20 alkoxy group, a halogen-containing group, a silicon-containing group, or a combination thereof, provided that the repeating unit bracketed by x is different from the repeating unit bracketed by y,
    m is an integer of 1 to 6, and
    x, y, and z represent a relative mole ratio of each repeating unit, and satisfy the following relations: $0.05 \leq x \leq 0.50$, $0.45 \leq y \leq 0.90$, $0.05 \leq z \leq 0.50$, and $x+y+z=1$.

2. The composition for forming a silica-based insulation layer as claimed in claim 1, wherein the organosilane-based condensation polymerization product has a weight average molecular weight (Mw) of about 3,000 to about 20,000.

3. The composition for forming a silica-based insulation layer as claimed in claim 1, wherein the organosilane-based condensation polymerization product is included in an amount of about 0.1 wt % to about 50 wt %, based on a total weight of the composition.

4. The composition for forming a silica-based insulation layer as claimed in claim 1, further comprising a thermal acid generator.

5. A silica-based insulation layer prepared from the composition for forming a silica-based insulation layer as claimed in claim 1.

6. The silica-based insulation layer as claimed in claim 5, wherein the insulation layer has a dielectric constant (k) of about 1.9 to about 3.5.

7. The silica-based insulation layer as claimed in claim 5, wherein the insulation layer has a modulus (E) of about 4 GPa to about 18 GPa.

8. A method of manufacturing a silica-based insulation layer, the method comprising
    coating the composition for forming a silica-based insulation layer as claimed in claim 1 on a substrate;

drying the substrate coated with the composition for forming a silica-based insulation layer; and curing the resultant at about 200° C. or more under an inert gas atmosphere.

9. The composition for forming a silica-based insulation layer as claimed in claim 1, wherein, in Chemical Formula 1, $R^1$ includes a hydroxy group, a C1 to C4 alkyl group, a C6 to C20 aryl group, a vinyl group, or a combination thereof.

10. A method of forming a silica based insulating layer, the method comprising:

reacting trialkoxysilane, bis(trialkoxy)silylalkane, and alkyltrialkoxysilane by a condensation reaction spin-coating the resultant in layer on a substrate, and heat curing the spin-coated layer.

11. A silica-based insulation layer prepared from the method as claimed in claim 10.

* * * * *